(12) United States Patent
Whitaker et al.

(10) Patent No.: US 8,957,763 B2
(45) Date of Patent: *Feb. 17, 2015

(54) RFID ACCESS METHOD USING AN INDIRECT MEMORY POINTER

(75) Inventors: Mark R. Whitaker, Colorado Springs, CO (US); Danny Lee Secrest, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 680 days.

This patent is subject to a terminal disclaimer.

(21) Appl. No.: 12/833,845

(22) Filed: Jul. 9, 2010

(65) Prior Publication Data

US 2012/0007722 A1    Jan. 12, 2012

(51) Int. Cl.
*G05B 23/00*    (2006.01)
*G11C 8/18*    (2006.01)

(52) U.S. Cl.
CPC ........................................ *G11C 8/18* (2013.01)
USPC ........................................................ 340/10.51

(58) Field of Classification Search
USPC .................. 340/10.51, 12.21, 505, 5.61, 3.3; 365/192; 714/758, 746, 722; 707/699
See application file for complete search history.

(56) References Cited

U.S. PATENT DOCUMENTS

| | | | |
|---|---|---|---|
| 5,608,725 A | | 3/1997 | Grube et al. |
| 5,890,199 A | * | 3/1999 | Downs ........................ 711/106 |
| 6,097,622 A | * | 8/2000 | Shimizu et al. ............... 365/145 |
| 6,498,741 B2 | | 12/2002 | Matsudera et al. |
| 6,725,413 B1 | | 4/2004 | Ishida |
| 6,901,494 B2 | | 5/2005 | Zumkehr et al. |
| 7,405,660 B2 | | 7/2008 | Diorio et al. |
| 7,475,273 B2 | | 1/2009 | Gredone et al. |
| 7,484,662 B2 | | 2/2009 | Schmidtberg et al. |
| 7,538,678 B2 | | 5/2009 | Jung et al. |
| 7,652,637 B2 | | 1/2010 | Taki et al. |
| 7,661,010 B2 | * | 2/2010 | DeFazio et al. ............... 713/500 |
| 7,737,725 B1 | * | 6/2010 | Ansari et al. .................... 326/41 |
| 7,742,348 B2 | * | 6/2010 | Schuessler .................... 365/192 |
| 7,836,382 B2 | * | 11/2010 | Dickin et al. ................. 714/776 |
| 2001/0000990 A1 | | 5/2001 | Matsudera et al. |
| 2005/0088285 A1 | | 4/2005 | Jei |
| 2005/0262272 A1 | * | 11/2005 | Christensen ..................... 710/8 |
| 2008/0143487 A1 | | 6/2008 | Hulvey |
| 2009/0276089 A1 | | 11/2009 | Bartholomew |

OTHER PUBLICATIONS

TI UHF Gen2 Protocol Reference Guide, Jul. 2006, p. 21.
USPTO Final Rejection for U.S. Appl. No. 12/833,836 dated Apr. 11, 2013; 7 pages.
USPTO Non-Final Rejection for U.S. Appl. No. 12/833,836 dated Aug. 15, 2013; 7 pages.

(Continued)

*Primary Examiner* — Vernal Brown

(57) ABSTRACT

A method of operating a memory in an RFID application includes locating a memory pointer at a fixed read/writeable memory location in the memory, determining a range of a pedigree buffer, initializing the memory pointer to a lowest value in the range, providing a second memory location that serves as a trigger address for an indirect write, and writing to a next location in the pedigree buffer by directing write data to the trigger address, which is then automatically written at a location pointed to by the memory pointer.

19 Claims, 17 Drawing Sheets

* WIRELESS / RFID OPERATION

(56) References Cited

OTHER PUBLICATIONS

USPTO Non-Final Rejection for U.S. Appl. No. 12/833,836 dated Oct. 11, 2012; 6 pages.

U.S. Appl. No. 12/833,836 "Fast Block Write Using an Indirect Memory Pointer" Mark R. Whitaker et al., filed on Jul. 9, 2010; 37 pages.

USPTO Notice of Allowance for U.S. Appl. No. 12/833,836 dated Dec. 13, 2013; 7 pages.

\* cited by examiner

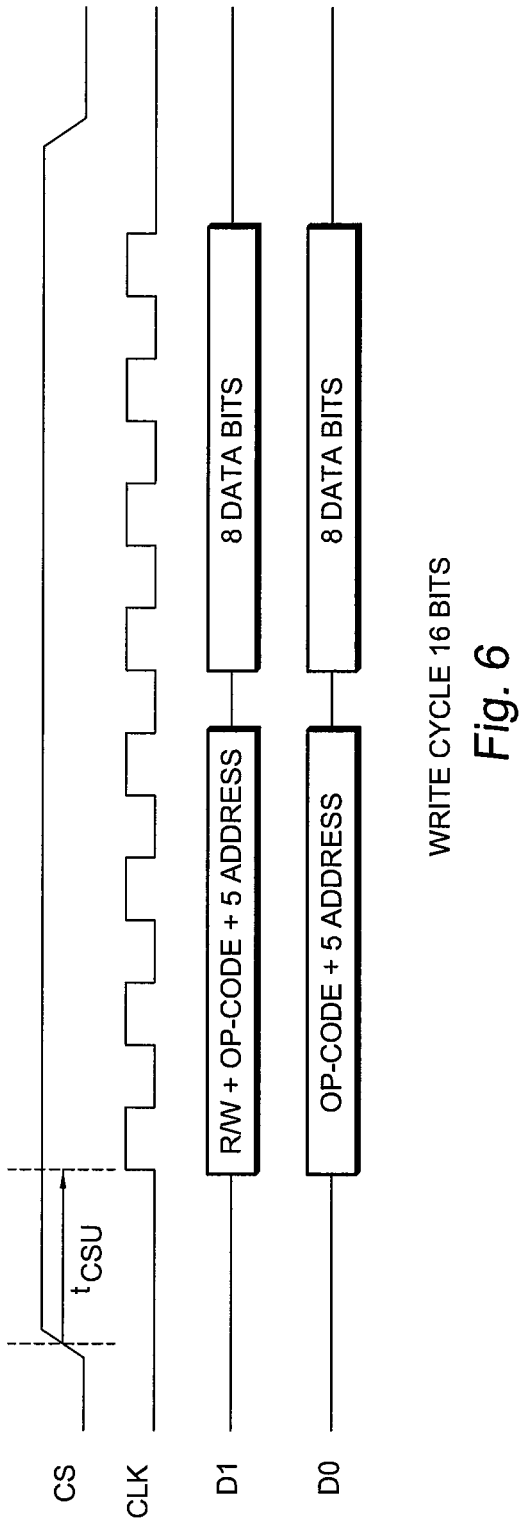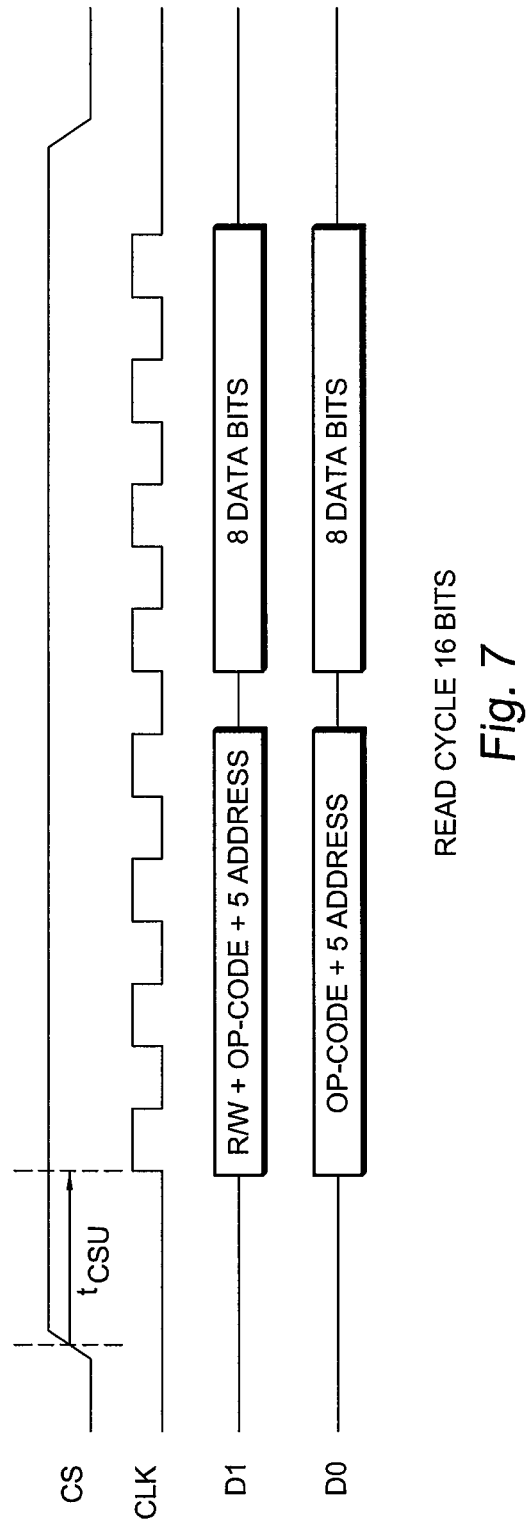

DETAILED VIEW OF THE FIRST 4 CLOCKS

DETAILED VIEW OF THE WRITE DATA

DETAILED VIEW OF THE READ DATA

BLOCK WRITE COMMAND

| | COMMAND | MEM BANK | WORD PTR | WORD COUNT | DATA | RN | CR6-16 |
|---|---|---|---|---|---|---|---|
| # OF BITS | 8 | 2 | EBV | 8 | VARIABLE | 16 | 16 |
| DESCRIPTION | 11000111 | 00:RESERVED<br>01:EPC<br>10:TID<br>11:USER | STARTING ADDRESS POINTER | NUMBER OF WORDS TO WRITE | DATA TO BE WRITTEN | HANDLE | |

* RF/ID TRANSACTION

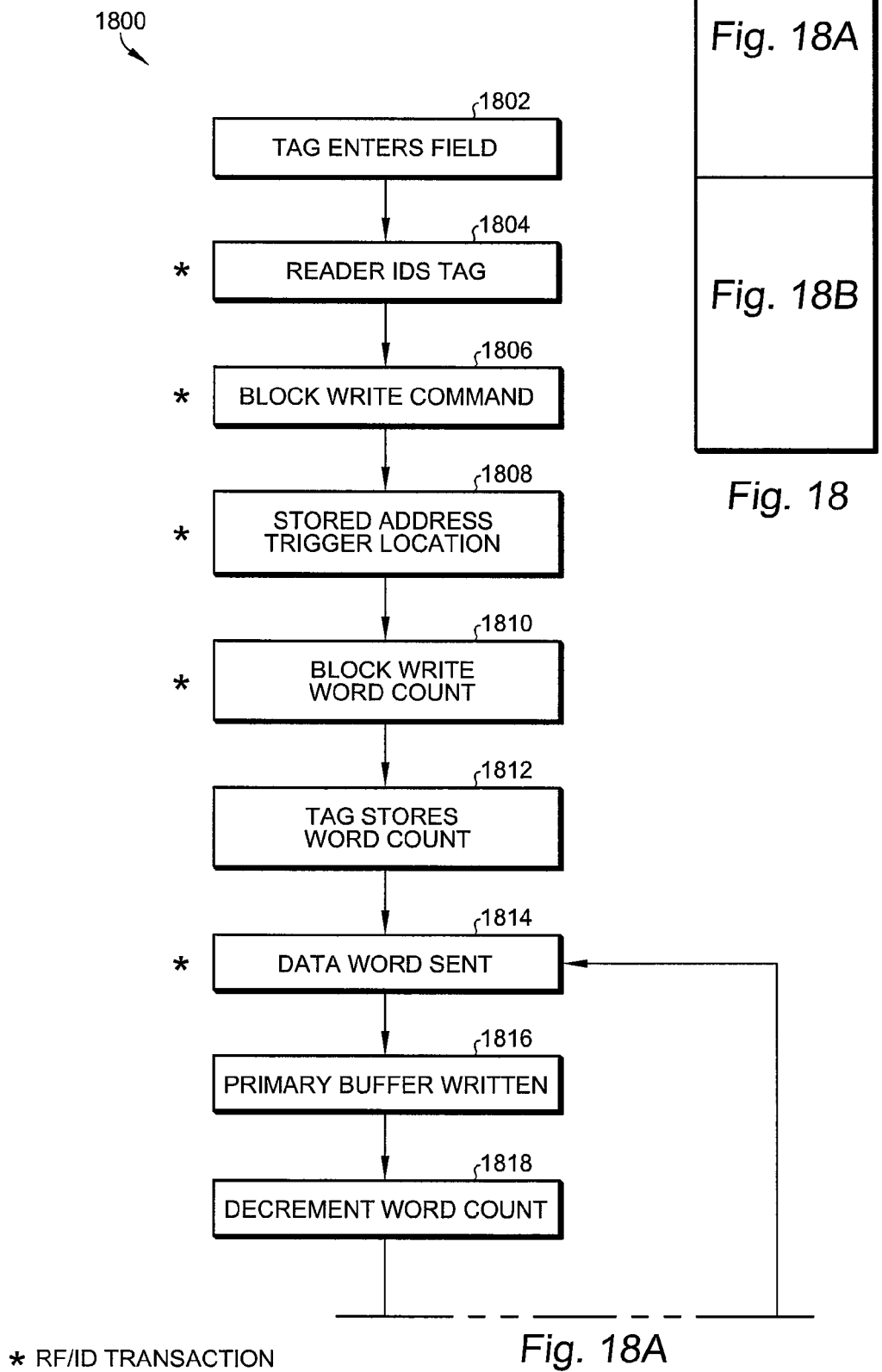

RFID ACCESS METHOD USING AN INDIRECT MEMORY POINTER

CROSS REFERENCE TO RELATED PATENT APPLICATIONS

The present invention is related to the subject matter disclosed in U.S. patent application Ser. No. 12/833,861, filed Jul. 9, 2010, now U.S. Pat. No. 8,723,654, issued on May 13, 2014, and to U.S. patent application Ser. No. 12/833,817, filed Jul. 9, 2010, and to U.S. patent application Ser. No. 12/833,836, filed Jul. 9, 2010, now U.S. Pat. No. 8,686,985, issued on Apr. 1, 2014, all of which are incorporated by reference herein in their entirety.

BACKGROUND OF THE INVENTION

1. Field of the Invention

The invention relates, in general, to the field of radio frequency identification (RFID) systems. More particularly, the invention relates in part to an RFID transponder incorporating FRAM memory. The invention also relates to a modified serial interface that has utility within and beyond RFID applications.

2. Discussion of the Related Art

As is well known in the art, a basic RFID system includes three components: an antenna or coil; a transceiver with decoder, i.e., RFID reader; and a transponder, i.e., RFID tag, programmed with unique information.

RFID tags are categorized as either active or passive. Active RFID tags are powered by an internal battery and are typically read/write, i.e., tag data can be rewritten and/or modified. Passive RFID tags operate without a separate external power source and obtain operating power generated from the reader.

An example of a typical passive RFID tag is shown in FIG. 1. Tag 100 includes an antenna 102 that is coupled to an analog front end circuit 104, which is in communication with a digital and memory circuit 106 through receive (RX) and transmit (TX) paths. Most passive RFID tags today use some sort of electrically erasable programmable read-only memory (EEPROM) such as flash memory.

While EEPROM memory has served in passive RFID tag applications to date, the demands for greater data throughput into and out of the RFID are increasing. This can be seen for example in factory environments, and in collecting highway tolls. The EEPROM based passive RFID tags, are slow and may not be suited for the higher throughput applications. Alternative, faster memories technologies such as FRAM ("Ferroelectric Random Access Memory") memory exist that are ideally suited for these new higher speed RFID applications. However, the entire protocol associated with transferring data input and out of the RFID tag is, generally speaking, EEPROM-related. To take advantage of alternative memory technologies, such as FRAM memory, what is desired are extensions to the existing data protocol that is optimized for operating a passive RFID tag incorporating FRAM memory.

The EPC Global Generation 2 standard includes a published method of doing Block Writes to memory. This method is inefficient when considering the capability of faster memory technologies, such as FRAM memory.

SUMMARY OF THE INVENTION

Accordingly, the present invention is directed to an RFID memory access method using an indirect memory pointer that substantially obviates one or more of the problems due to limitations and disadvantages of the related art.

According to the present invention a method of operating a memory in an RFID application includes locating a memory pointer at a fixed read/writeable memory location in the memory, determining a range of a pedigree buffer, initializing the memory pointer to a lowest value in the range, providing a second memory location that serves as a trigger address for an indirect write, and writing to a next location in the pedigree buffer by directing write data to the trigger address, which is then automatically written at a location pointed to by the memory pointer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 6-10 are timing diagrams associated with the serial interface circuit shown in FIG. 5;

FIG. 16 is an EPC global BlockWrite command data structure according to the prior art;

FIGS. 18A and 18B taken together represent a flow chart of a method for implementing the BlockWrite command according to the present invention;

DETAILED DESCRIPTION OF THE ILLUSTRATED EMBODIMENTS

Figure 1:
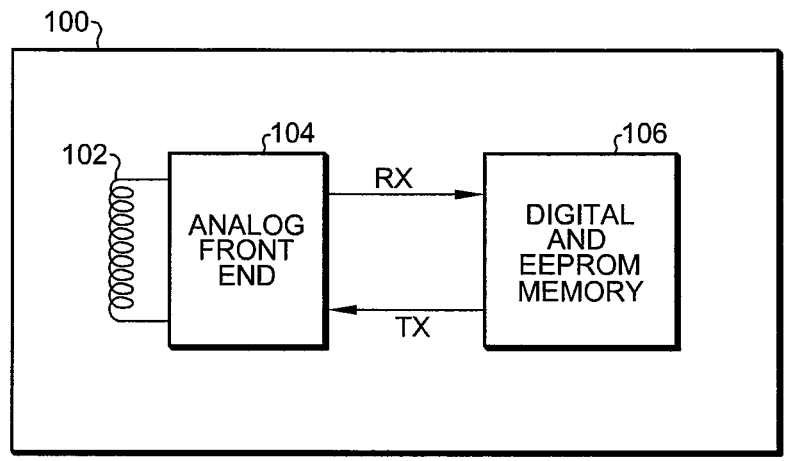
FIG. 1 is a block diagram of a prior art EEPROM based passive RFID tag.
Figure 2:
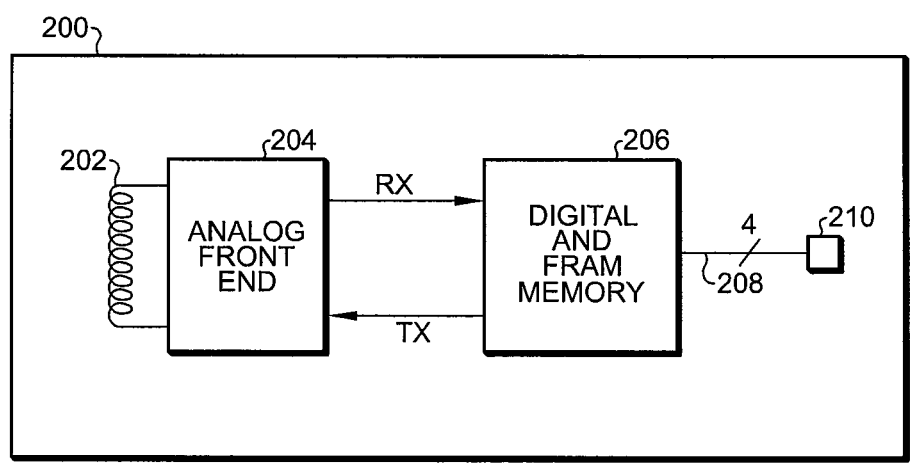
FIG. 2 is a block diagram of a FRAM memory based passive RFID tag according to the present invention.

Referring now to FIG. 2, a passive RFID tag 200 according to the invention includes an antenna 202, an analog front end 204, and a digital portion 206 that includes digital control circuitry and FRAM memory and communicates with the analog front end 204 using the RX and TX paths. Additionally, RFID tag 200 includes a serial interface bus 208 coupled to pins 210. A four bit wide bus 208 is shown in FIG. 2. The analog and digital portions of the RFID circuit 204 and 206 are normally integrated on to one or more integrated circuits. In the common/usual passive tag implementation shown in FIG. 2, the serial interface is normally not present and pins 210 are not used.

Figure 3:
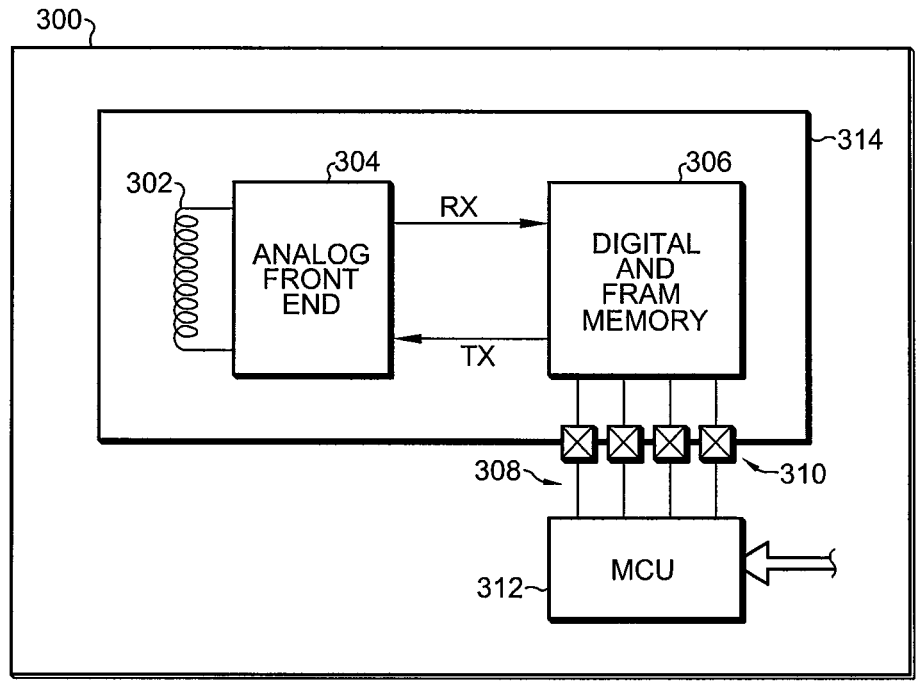
FIG. 3 is a block diagram of an embedded FRAM memory based RFID application.

Referring now to FIG. 3, an embedded RFID application 300 according to the present includes an RFID integrated circuit 314, which contains the analog front end 304 and the digital and FRAM memory portion 306. The antenna 302 may or may not be actually included in the RFID integrated circuit 314. Note in FIG. 3 that four pins 310 associated with the serial interface of the digital portion 316 are brought out. The four pins 310 are the chip select, clock, DATA 1, and DATA 2 pins, which are explained in further detail below. The serial interface is typically coupled to a microprocessor 312, which is in communication with various control inputs associated with the RFID application 300. A typical application 300 could be a metering application, or a control application for a factory. The RFID integrated circuit 314 in a typical embedded application would be interrogated from time to time with a handheld reader (not shown in FIG. 3).

Figure 4:
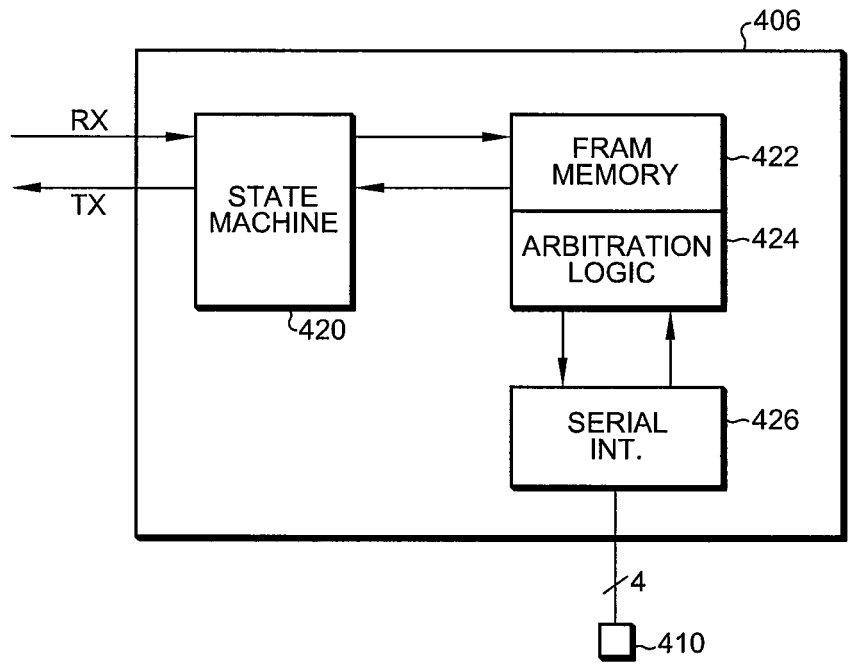
FIG. 4 is a further detailed block diagram of the digital portion of the FRAM based RFID circuit shown in FIGS. 2 and 3.

Referring now to FIG. 4, the digital portion of the circuits of FIGS. 2 and 3 is shown in greater detail. Digital portion 406 includes the RX and TX paths for reference with FIGS. 2 and 3. The RX and TX paths are in communication with a state machine 420 that is in bi-directional communication with FRAM memory block 422. An arbitration logic block 424 is associated with FRAM memory 422, and is used to bi-directionally control serial interface 426. In turn, serial interface 426 is coupled through a four bit bus to external pins 410.

Figure 5:
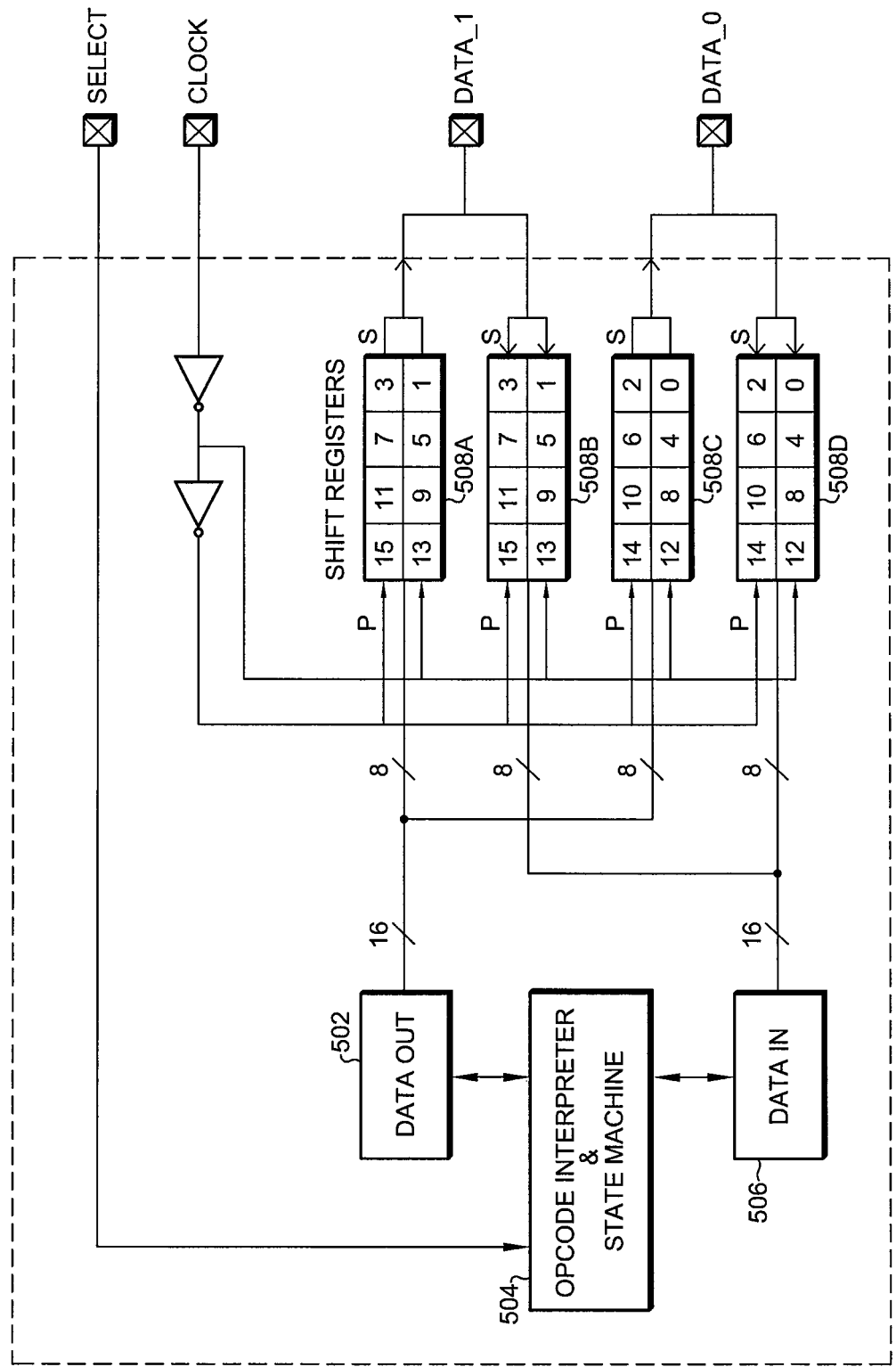
FIG. 5 is a further detailed block diagram of the serial interface of the FRAM based RFID circuit shown in FIGS. 2 and 3.

Referring now to FIG. 5, further details of the serial interface 426 of FIG. 4 are shown. As known in the art, a conventional SPI interface has four pins: Select, Clock, DataIn, and DataOut. To transfer one byte of data, either in or out, requires eight clock cycles, in addition to the data dependent transitions on the single data line. The serial interface 500 shown in FIG. 5 appears to be similar to a SPI interface, but there are two important improvements. First, both data ports are used as a bidirectional pair. Second, both edges of the clock are used to shift or transfer data. With both of these improvements, only a pair of clock cycles is used to transfer a byte of data. The power used in data transitions is constant, but the power used for clock transitions is cut by a factor of four. Optionally, a single edge of the clock can be used, rather than both edges. Although this requires more power than the dual edge solution according to the present invention, the single edge solution still saves power when compared to the traditional SPI interface. Thus, the serial interface 500 shown in FIG. 5 is but one of the features for improving throughput in a FRAM memory based passive RFID tag or circuit, although it has utility in non-RFID applications as well. Specifically, serial interface 500 minimizes the number of clock transitions required to transmit a data word when compared to the convention SPI interface, while retaining the same pin count.

In FIG. 5, serial interface 500 includes a Select pin, a Clock pin, a bidirectional Data_1 pin, and a bidirectional Data_0 pin. The Select pin is coupled to an OpCode Interpreter and State Machine 504, which is realized in conventional logic circuits. State machine 504 is in bidirectional communication with Data Out register 502 and Data In register 506. Data Out register 502 is coupled through a 16 bit bus, which branches to two 8 bit busses, to shift register 508A and shift register 508C. Similarly, Data In register is coupled through a 16 bit bus, which branches to two 8 bit busses, to shift register 508B and 508D. Shift register 508A loads data onto the Data_1 pin, shift register 508B receives data from the Data_1 pin, shift register 508C loads data onto the Data_0 pin, and shift register 508D receives data from the Data_0 pin. Shift registers 508A through 508D are operated by alternative clock cycles through inverters 510 and 512. The clocking and transfer scheme of the serial interface 500 is further explained with respect to the timing diagrams of FIGS. 6-10. Based on the received command, the state machine produces the read or write control signal. It also transfers the address and data from the shift registers and applies them to the FRAM as appropriate.

Referring now to FIG. 6, the write cycle for 16 bits of information is shown. The CS Chip Select signal goes high, and, after a predetermined delay time of $t_{CSU}$, the write cycle begins. During the first four clock cycles of the CLK pin, the D1 data word includes a R/W bit, opcode information, and five address bits. An opcode can include information regarding an operational mode such as "test", "normal", "status", or "control". During the second four clock cycles of the CLK pin, the D1 data word includes eight data bits which will be written to the FRAM memory. Similarly, during the first four cycles of the CLK pin, the D0 data word includes opcode information and five address bits. During the second four clock cycles of the CLK pin, the D0 data word includes eight data bits, also written to the FRAM memory.

Referring now to FIG. 7, the read cycle for 16 bits of information is shown. The CS Chip Select signal goes high, and, after a predetermined delay time of $t_{CSU}$, the read cycle begins. During the first four clock cycles of the CLK pin, the D1 data word also includes a R/W bit, opcode information, and five address bits. During the second four clock cycles of the CLK pin, the D1 data word includes eight data bits from the FRAM memory. Similarly, during the first four cycles of the CLK pin, the D0 data word also includes opcode information and five address bits. During the second four clock cycles of the CLK pin, the D0 data word includes eight data bits, also from the FRAM memory.

Figure 8:
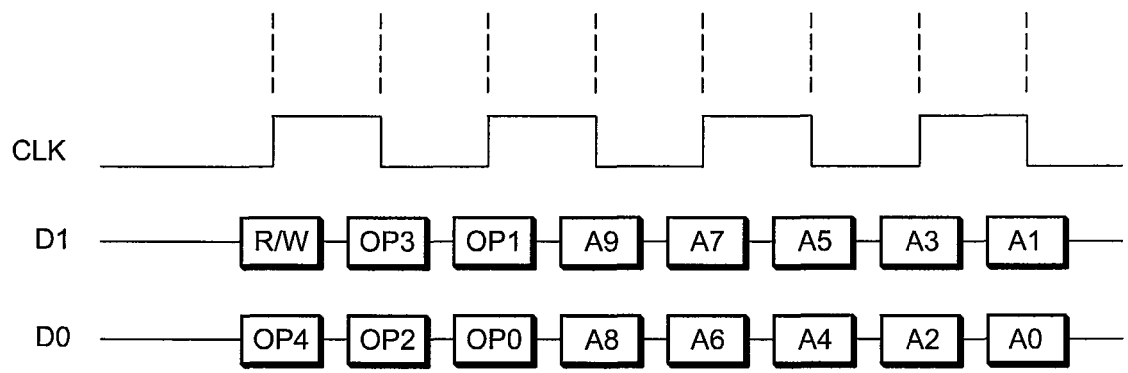

Referring now to FIG. 8 a detailed view of the first four clock cycles is shown. The first high transition of the CLK signal is used to transfer the R/W bit on D1 and to transfer the OP4 bit on D0. The first low transition of the CLK signal is used transfer the OP3 bit on D1 and to transfer the OP2 bit on D0. The second high transition of the CLK signal is used to transfer the OP1 bit on D1 and to transfer the OP0 bit on D0. The second low transition of the CLK signal is used transfer the A9 bit on D1 and to transfer the A8 bit on D0. The third high transition of the CLK signal is used to transfer the A7 bit on D1 and to transfer the A6 bit on D0. The third low transition of the CLK signal is used transfer the A5 bit on D1 and to transfer the A4 bit on D0. The fourth high transition of the CLK signal is used to transfer the A3 bit on D1 and to transfer the A2 bit on D0. The fourth low transition of the CLK signal is used transfer the A1 bit on D1 and to transfer the A0 bit on D0.

Figure 9:
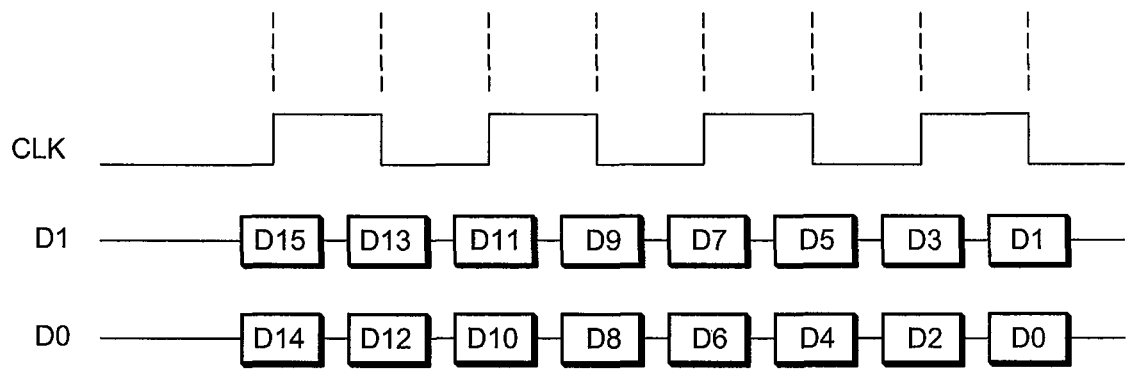

Referring now to FIG. 9 a detailed view of the write data is shown. The first high transition of the CLK signal is used to transfer the D15 bit on D1 and to transfer the D14 bit on D0. The first low transition of the CLK signal is used transfer the D13 bit on D1 and to transfer the D12 bit on D0. The second high transition of the CLK signal is used to transfer the D11 bit on D1 and to transfer the D10 bit on D0. The second low transition of the CLK signal is used transfer the D9 bit on D1 and to transfer the D8 bit on D0. The third high transition of the CLK signal is used to transfer the D7 bit on D1 and to transfer the D6 bit on D0. The third low transition of the CLK signal is used transfer the D5 bit on D1 and to transfer the D4 bit on D0. The fourth high transition of the CLK signal is used to transfer the D3 bit on D1 and to transfer the D2 bit on D0. The fourth low transition of the CLK signal is used transfer the D1 bit on D1 and to transfer the D0 bit on D0.

Figure 10:
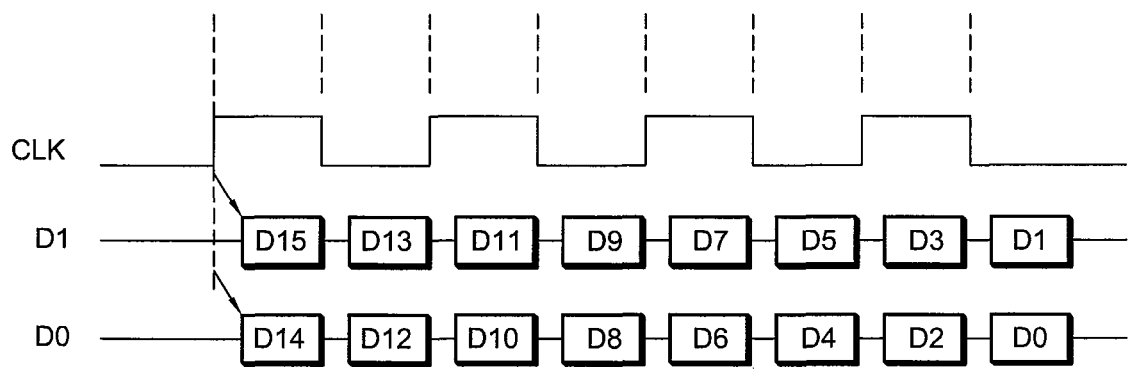

Referring now to FIG. 10 a detailed view of the read data is shown. The first high transition of the CLK signal is used to drive the D15 bit on D1 and to transfer the D14 bit on D0. The first low transition of the CLK signal is used transfer the D13 bit on D1 and to transfer the D12 bit on D0. The second high transition of the CLK signal is used to transfer the D11 bit on D1 and to transfer the D10 bit on D0. The second low transition of the CLK signal is used transfer the D9 bit on D1 and to transfer the D8 bit on D0. The third high transition of the CLK signal is used to transfer the D7 bit on D1 and to transfer the D6 bit on D0. The third low transition of the CLK signal is used transfer the D5 bit on D1 and to transfer the D4 bit on D0. The fourth high transition of the CLK signal is used to transfer the D3 bit on D1 and to transfer the D2 bit on D0. The fourth low transition of the CLK signal is used transfer the D1 bit on D1 and to transfer the D0 bit on D0.

One possible use of increased user memory space on an RFID device is to store a pedigree or other sequential set of tracking information. One way to store this information in the prior art might be to read the device memory until a vacant location is found. This is clearly inefficient. Memory storage could be better managed if the RFID system had a known location to use as an address pointer. Then, the RFID system could read the known location to determine the next available memory location. Still, this requires multiple memory accesses and multiple RFID command/response rounds. This slows throughput on, for example, an assembly line.

Figure 13:
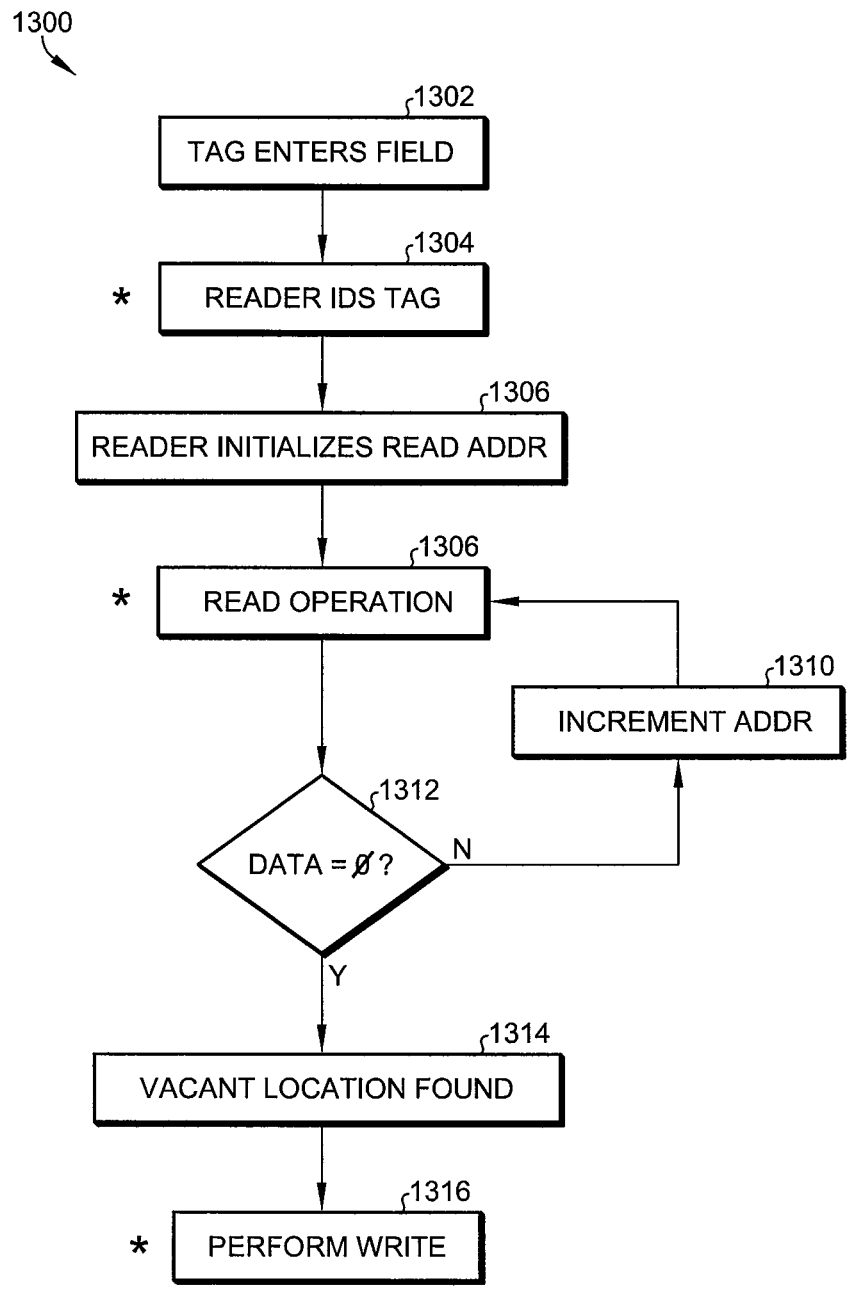
FIG. 13 is a flow chart of a prior art technique for reading and writing data to memory.

A first memory storage technique 1300 according to the prior art is shown in the flow chart of FIG. 13, wherein the RFID tag has no present location indicator. Each occurrence of a wireless/RFID operation is denoted by an asterisk. At step 1302, an RFID tag enters a field produced by, for example, a reader. At step 1304, the reader identifies the RFID tag. At step 1306, the reader initiates the read address. At step 1308 the read operation commences. At step 1312, the data contents are read. If there is already data at that location, the address is incremented at step 1310, and the data contents are again read. This process is repeated until a zero data location is found. Once a zero data location is found at step 1314, the new data is written to memory at step 1316. It can be seen from the flow chart of FIG. 13 that there are a number of (depending on the number of times through the loop) separate steps in which a wireless/RFID operation is performed.

Figure 14:
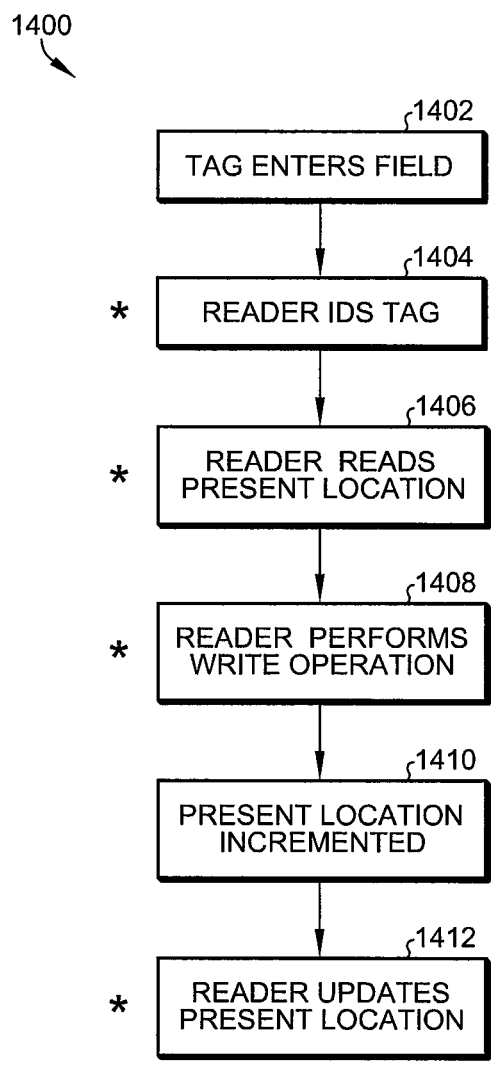
FIG. 14 is a flow chart of another prior art technique for reading and writing data to memory.

A second memory storage technique 1400 according to the prior art is shown in the flow chart of FIG. 14, wherein the RFID tag has a present location indicator at a defined location. Again, each occurrence of a wireless/RFID operation is denoted by an asterisk. At step 1402, an RFID tag enters a field produced by, for example, a reader. At step 1404, the reader identifies the RFID tag. At step 1406, the reader reads the present location. At step 1408 the reader performs a write operation. At step 1410, the present location indicator is incremented. Finally, at step 1412 the reader updates the present location. It can be seen from the flow chart of FIG. 14 that there are four separate steps in which a wireless/RFID operation is performed.

According to the present invention, a memory pointer is located at a fixed read/writeable memory location. The user determines the range of his pedigree buffer and initializes the memory pointer to the lowest value in that range. A second memory location serves as the trigger address for the indirect write. When a user wants to write to the next location in the pedigree buffer, that write data is directed to the trigger address instead, and the controller will automatically write to the location pointed to by the memory pointer. When that write is complete, the controller increments the memory pointer to the next available location. Also, the controller will manage the behavior of subsequent memory accesses by interpreting the two associated control bits. These can operationally allow the pedigree buffer to automatically wrap back to the beginning for a case where much data is expected, but only the most recent records are necessary, or can be used to lock the data in locations below the pointer so that they cannot be overwritten by another operation, including a direct write to the memory.

Figure 12:
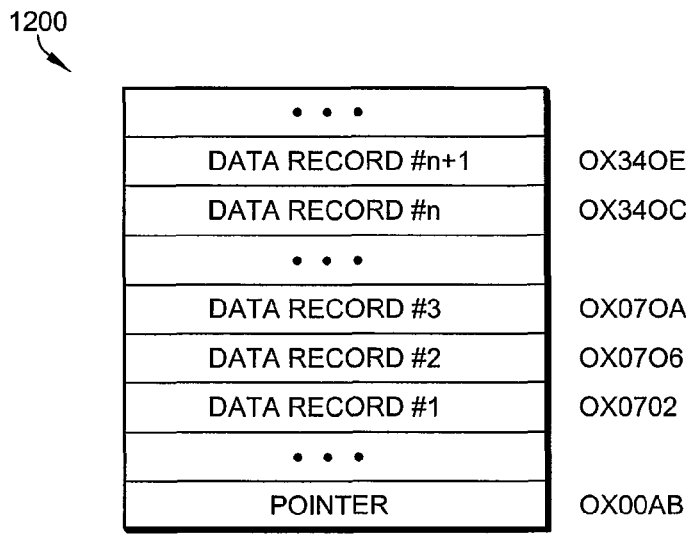
FIG. 12 is a portion of the memory contents associated with the memory pointer circuit of FIG. 11.

A portion of a memory 1200 using the pointer according to the present invention is shown in FIG. 12. In the example of the memory shown in FIG. 12, the pointer is located at address 0xAB, and the data records are built up through the remainder of the memory. At the time the first record is written, the value in the pointer location will be updated to 0x0706, to point to the first unused location after the previous record. When that location is subsequently written, the value of the pointer will change to 0x070A. This process continues for the remainder of the memory.

Figure 11:
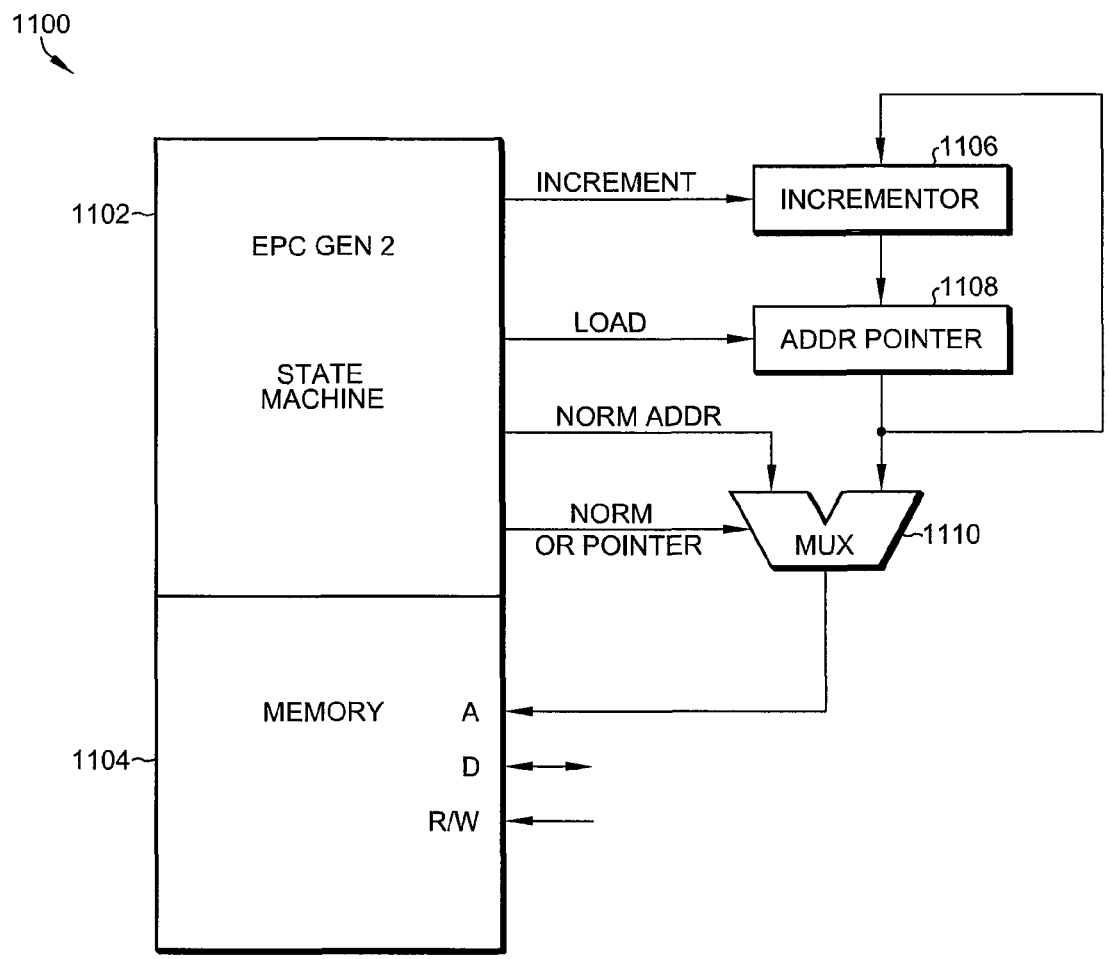
FIG. 11 is a block diagram of a memory pointer circuit associated with the digital portion of the FRAM based RFID circuit shown in FIGS. 2 and 3.

While the following description of the present invention is in reference to the Gen 2 EPC (Generation 2 Electronic Product Code) protocol, it is apparent to those skilled in the art that the present invention may be easily extended to include other RFID protocols as well. A block diagram 1100 of a state machine, memory, and associated circuitry for carrying out the pointer method of the present invention is shown in FIG. 11. The memory pointer circuit includes a Gen 2 EPC state machine 1102 for providing the Increment, LOAD, NormAddr, and Norm or Pointer control signals. State machine 1102 is a typical Gen 2 decoder, with the addition of controls for loading or incrementing the Address Pointer location, as well as selecting the stored or standard address value. Memory 1104 includes address, data, and R/W signals. An Incrementor 1106 has an input and an output, and receives the Increment signal. The Address Pointer register 1108 has an input and an output, and receives the LOAD signal. The output of register 1108 is coupled to the input of Incrementor 1106. A multiplexer 1110 receives the normal address at a first input, and the output of address pointer 1108 at a second input. The output of multiplexer 1110 is controlled by the normal or pointer control signal provided by state machine 1102. The output of multiplexer 1110 is coupled to the address input of memory 1104.

The state machine 1102 shown in FIG. 11 represents the entire EPC Gen2 protocol processor. The primary external input for this is the RX (received data) signal, which comes from the analog front end chip, as is shown in FIG. 2. The state machine 1102 processes the Gen2 commands; the block write command shown in FIG. 16 is an example of one of these commands. Depending on the nature of the specific command, the state machine 1102 may do a single or multiple memory read or write. In addition to the address control that is shown in FIG. 11, the state machine 1102 also provides the read/write control (R/W) and data (D).

Figure 15:
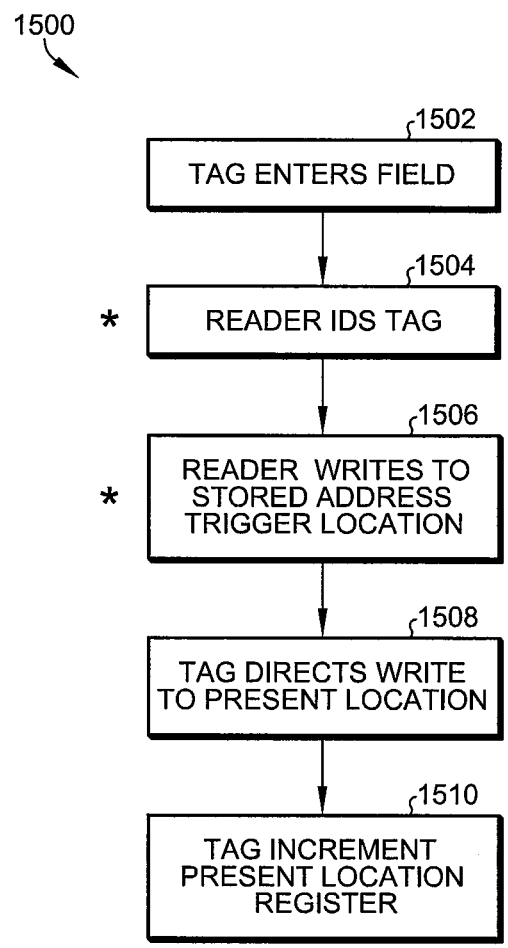
FIG. 15 is a flow chart of a technique according to the present invention for reading and writing data to memory using the memory point circuit of FIG. 11.

The method 1500 for operating the memory pointer circuit shown in FIG. 11 is shown in flow chart form in FIG. 15. Wireless/RFID operations are again denoted with an asterisk.

According to the present invention, a tag enters the reader field at step 1502. At step 1504, the reader identifies the RFID tag. At step 1506 the reader writes to the stored address trigger location. At step 1508, the tag directs a write to the present location. At step 1510 the tag increments the present location register. Note that only two wireless/RFID operations are undertaken in the method 1500 of the present invention. Thus, interrogations of the RFID tag are minimized, and data throughput is desirably maximized.

The command structure 1600 of the EPC Global Block-Write command is shown. The timing sequence of the command is indicated in the bit fields as shown in FIG. 16, from left to right. Included are the Command, MemBank, WordPtr, WordCount, Data, RN, and CRC (Cyclic Redundancy Check) bit fields. In an RFID application, a receiver must transfer all the bits and compute a CRC across the entire command, as well as providing a local buffer for the data. Until the entire command has been received and the locally computed CRC is compared to the external CRC (the last part of the command) the validity of the command, and particularly the address or data values, cannot be ascertained. If the two CRC values do not match, the entire command must be discarded.

For EEPROM or Flash memory technologies, BlockWrites are difficult given the slow write times of those technologies. They further require the use of an internal buffer to save all of the data prior to checking the message CRC.

Figures 17, 17A, 17B:
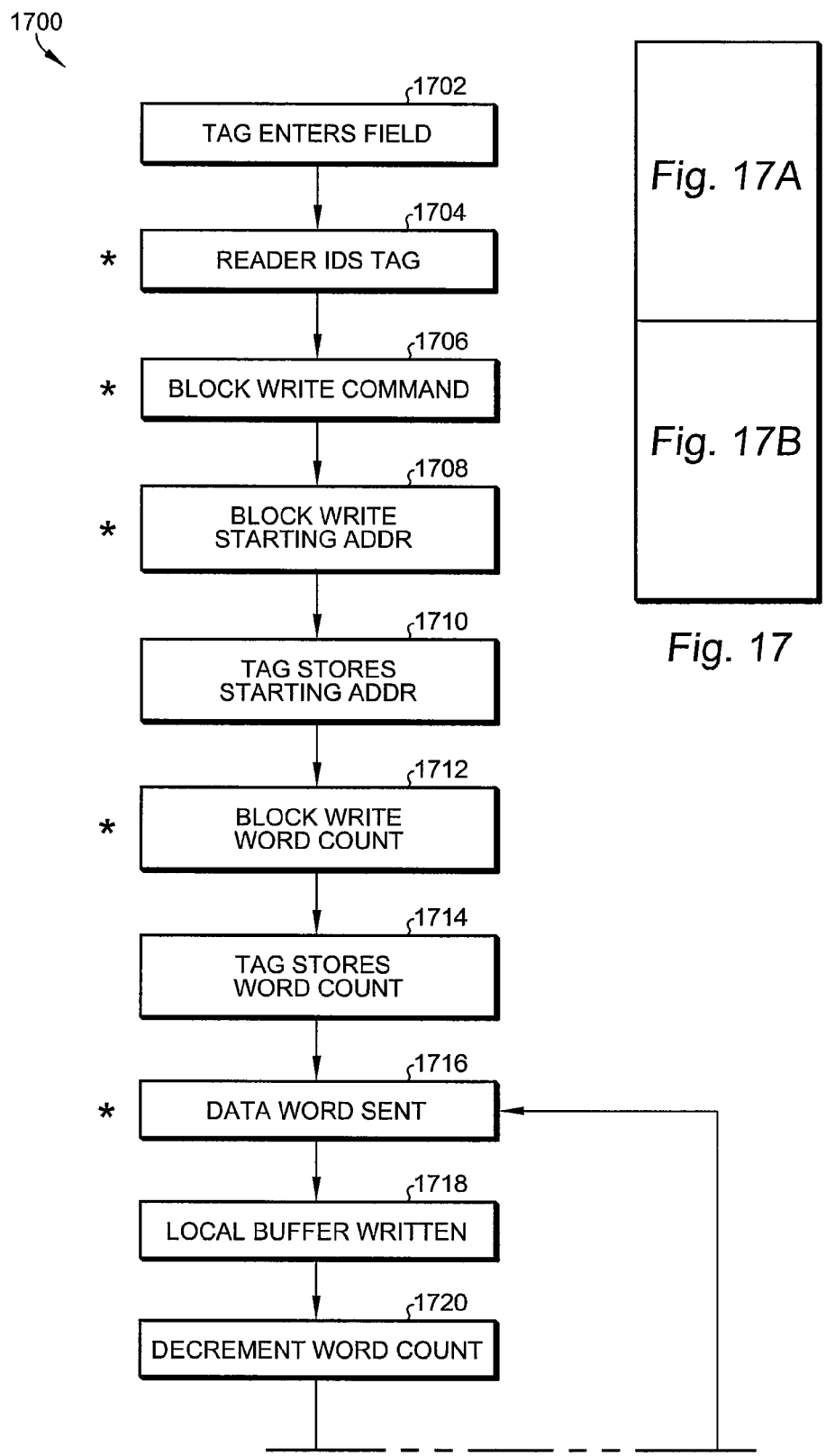
FIGS. 17A and 17B taken together represent a flow chart of a prior art method for implementing the BlockWrite command.
Figure 17B:
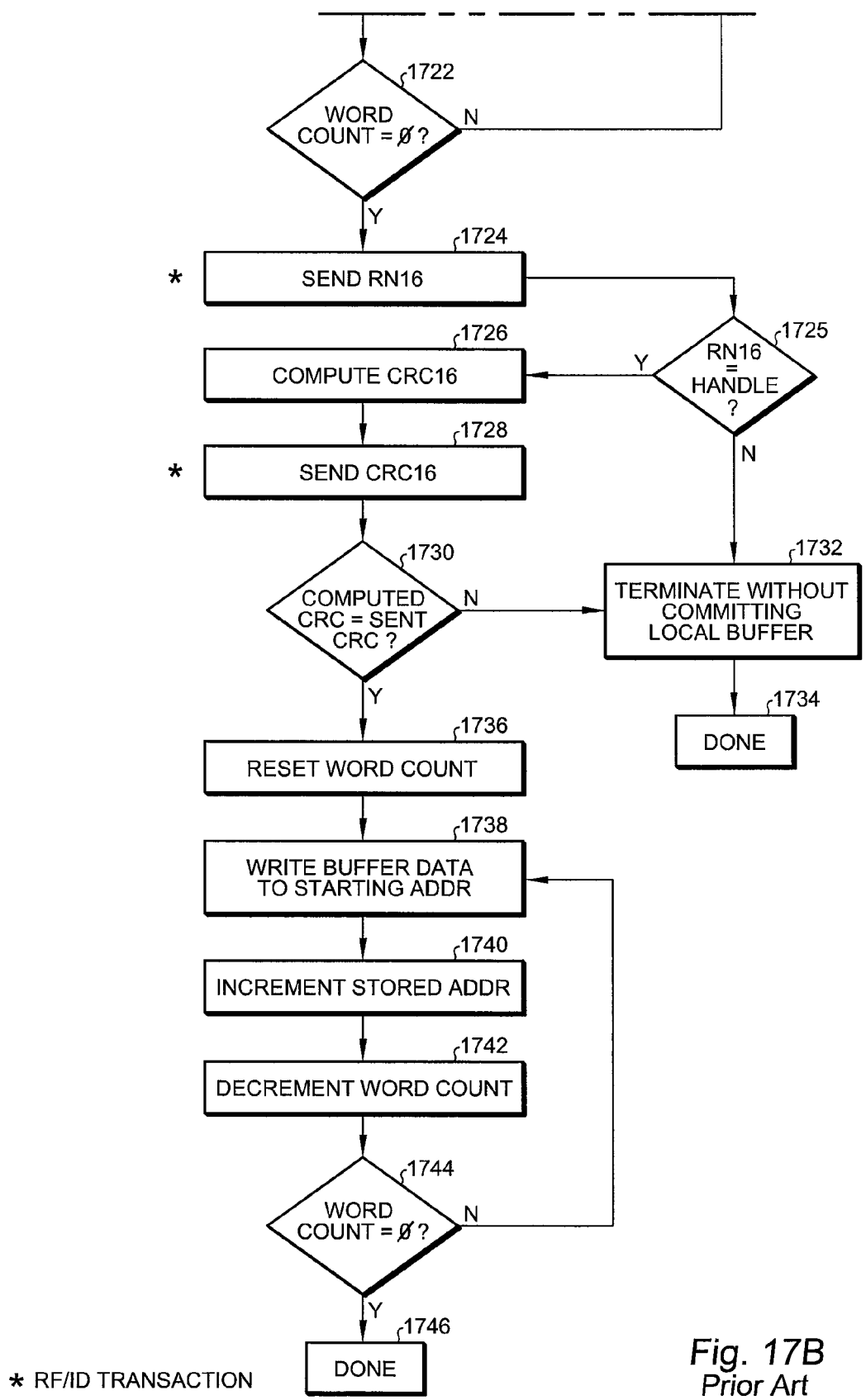

A traditional BlockWrite method according to the prior art is shown in FIGS. 17A and 17B. Referring to FIG. 17A, at step 1702 an RFID tag enters the field. At step 1704 the reader identifies the RFID tag. At step 1706 the Command bits of the BlockWrite command are received from the reader. At step 1708 the BlockWrite Word Pointer is received from the reader. At step 1710 the RFID tag stores this as the starting address. At step 1712 the BlockWrite Word Count is received from the reader. At step 1714 the RFID tag stores the word count. At step 1716 each data word is received from the reader. At step 1718 this word is written to a local buffer. At step 1720 the word count is decremented. Referring now to FIG. 17B, at decision block 1722 the word count is interrogated to find a zero word count. If the word count is not zero, the method is performed again starting at step 1716. If the word count is zero, then the method continues to step 1724 and the RN16 handle is received from the reader. The received handle is compared at step 1725 to the stored handle. If they match, the method continues to step 1726. If they do not match, the method continues directly to step 1732 where it is terminated without committing the local buffer contents to main memory and the method is completed at block 1734. At step 1726 the internal CRC16 is computed. At step 1728 the expected CRC16 is sent. At decision block 1730, the computed CRC is compared to the sent CRC. If they are different, then the RFID interaction is terminated at step 1732 without committing the local buffer contents to main memory, and the method is done 1734. If the computed CRC is the same as the sent CRC, then the method continues at step 1736 and the word count is reset. At step 1738 a word of buffer data is written to the starting address. At step 1740 the stored address is incremented. At step 1742 the word count is decremented. At decision block 1744, the word count is checked to see if it is zero or not. If the word count is non-zero, then the method is repeated starting with step 1738. If the word count is zero, then the prior art method is done at step 1746.

The method of the present invention includes several improvements. First, by using a stored address pointer, the address is always known. Second, since the user can point the starting address at a known safe block, there is no need for an intermediate buffer as in the prior art. The data can be written to the safe area, and the CRC computed as is normally done. If it matches, the data is retained and the address pointer is updated. If it does not, the address pointer is kept and the write can be repeated. The main advantage of the invention, however, is that using it (in conjunction with FRAM or other high speed nonvolatile memory) enables writes to be performed "on-the-fly" and without excessive area penalty, even though the EPC global protocol for Block Writes does not adequately support arbitrarily long, verified writes.

Figure 18B:
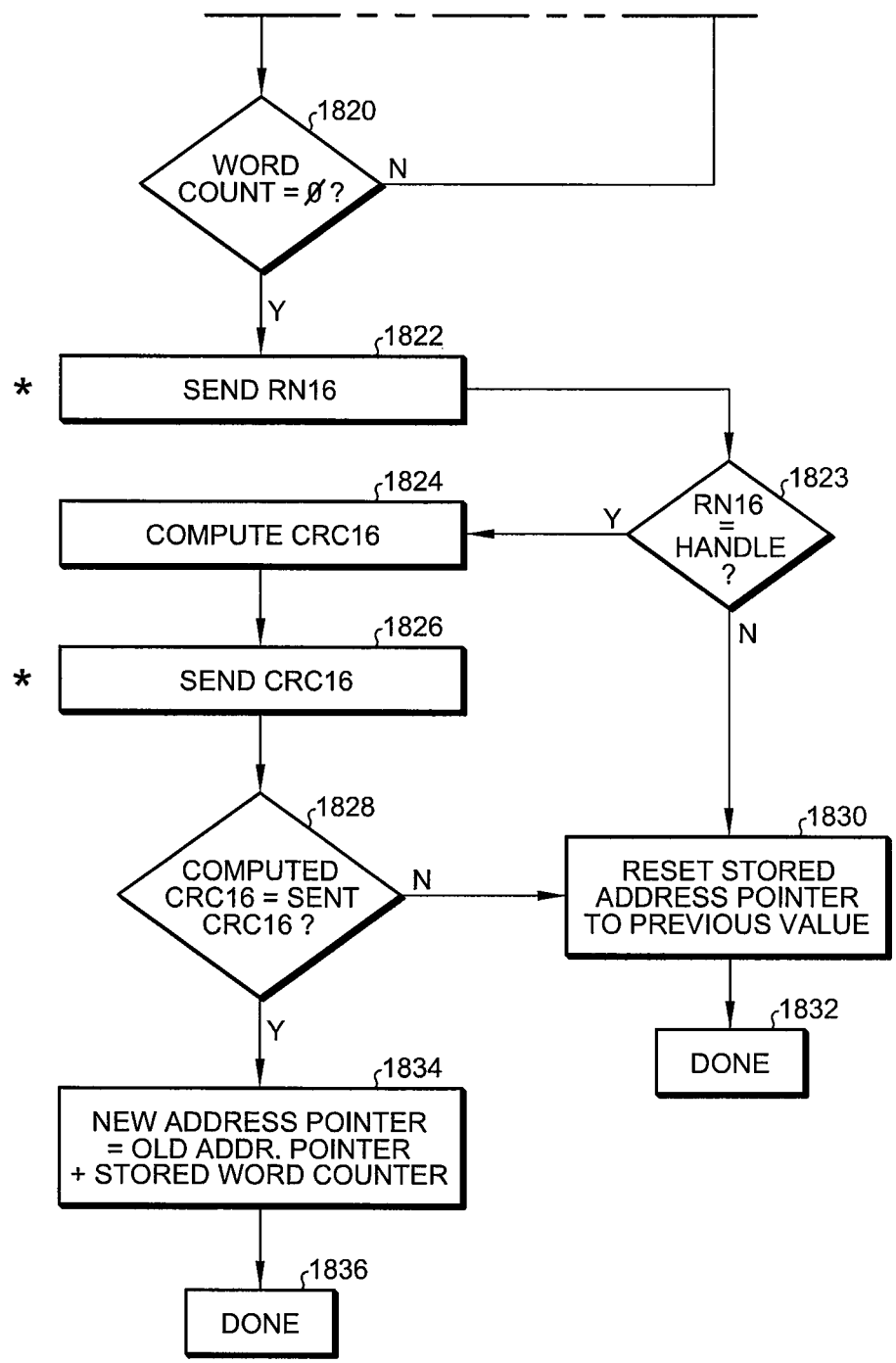

The BlockWrite method of the present invention is shown in a flow chart 1800 of FIGS. 18A and 18B. Referring now to FIG. 18A, the method of the present invention uses a stored address on the RFID chip to write to the next unoccupied memory space, which is a safe area and will not overwrite previously written memory contents. At step 1802 the RFID tag enters the field. At step 1804 the reader identifies the tag. At step 1806 the BlockWrite command is initiated. At step 1808, the stored address trigger location is received and recognized. At step 1810 the BlockWrite word count is received. At step 1812 the tag stores the word count. At step 1814 the first data word is sent. At step 1816 the primary buffer is written. At step 1818 the word count is decremented. Referring now to FIG. 18B, at step 1820 the word count is checked to see if it is zero or not. If the word count is not zero, then the method is repeated starting at step 1814. If the word count is zero, then the method is continued, and the RN16 handle is sent at step 1822. The received handle is compared at step 1823 to the stored handle. If they match, the method continues to step 1824. If they do not match, the method continues directly to step 1830 where it is terminated without committing the local buffer contents to main memory and the method is completed at block 1832. At step 1824 the internal CRC16 is computed. At step 1826 the expected CRC16 is sent. At decision block 1828 the computed CRC16 is compared to the sent CRC16. If the answer is no, the stored address pointer is reset to its previous value at step 1830, and the method is done at step 1832. If the answer is yes, then a new address pointer location is set to the old address pointer location plus the stored word count at step 1834, and the method is terminated at step 1836. The method according to the present invention assures that new information is always sent to a safe area, and that previously written memory contents are not overwritten.

RFID devices with secondary interfaces such as the embedded application shown in FIG. 3 usually have an embedded controller that arbitrates memory access. Such a solution requires significant power and thus limits the effectiveness and range of the RFID tag. What is desired is a solution for controlling the secondary interface without using an embedded controller.

Figure 19:
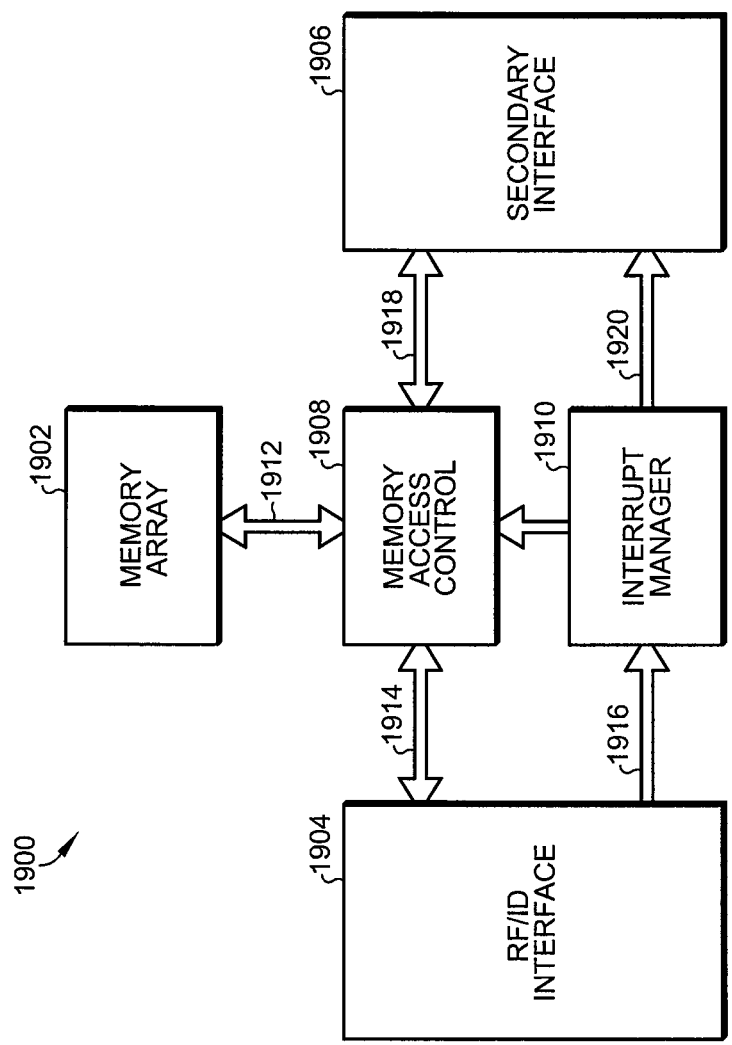
FIG. 19 is an alternative block diagram representation of a portion of the digital circuitry associated with the circuits of FIGS. 2 and 3, according to the present invention, including an interrupt manager block.

The method of the present invention allows a simple, effective means of memory access control for an RFID circuit having two primary access ports as shown in FIG. 3, and explained in further detail with respect to FIG. 19.

According to the present invention, an RFID reader initiates an interrupt by writing data to two known addresses in the available memory space. The order is not important, but the data from the two writes must satisfy some relationship. In the first implementation, the two 16-bit words must XOR to a hexadecimal value of 0x1234. Also, the data is only transferred for comparison at the first write to each location after a reset. A reset will also occur at the end of the process as well as at power-on.

If the data does satisfy this condition, a rising edge interrupt is sent out via the serial port chip select. This pin is generally an input, but for this purpose is an output. The external controller will sense this rising edge (or high level) as an interrupt. The proper response is to issue two full clock cycles on the serial port clock pin. This will acknowledge the interrupt and cause the RFID device to release the full serial interface port for subsequent access. At the same time, it will disable the RF interface from being able to attempt a memory access.

When the external serial controller is finished with its transactions, it sends a specific op code or command which the RFID device recognizes as the end of the serial controller's access session. The serial bus is reconfigured to an inert state, so that the serial controller can no longer control it, and the RFID device resumes its normal activity. The interrupt controller will be reset to allow an additional interchange if desired.

Referring now to FIG. 19, the memory access is controlled by the Interrupt Manager 1910, which communicates with the memory access control block via bus 1922. In turn, the memory access control block communicates with the memory array 1902 through bidirectional bus 1912. An RFID interface 1904 communicates with memory access control block 1908 via bidirectional bus 1914, and with interrupt manager 1910 through bus 1916. The secondary interface 1906 communicates with memory access control 1908 via bidirectional bus 1918, and with interrupt manager 1910 through bus 1920. One or the other of interfaces 1904 and 1906 must be the interrupt master, and have initial control of the memory 1902. Upon a proper command, that interface can relinquish control and allow the other to take over. When the secondary interface is finished, it signals to the interrupt manager to relinquish the memory busses, and allows the primary interface to have control once again.

Figure 20A:
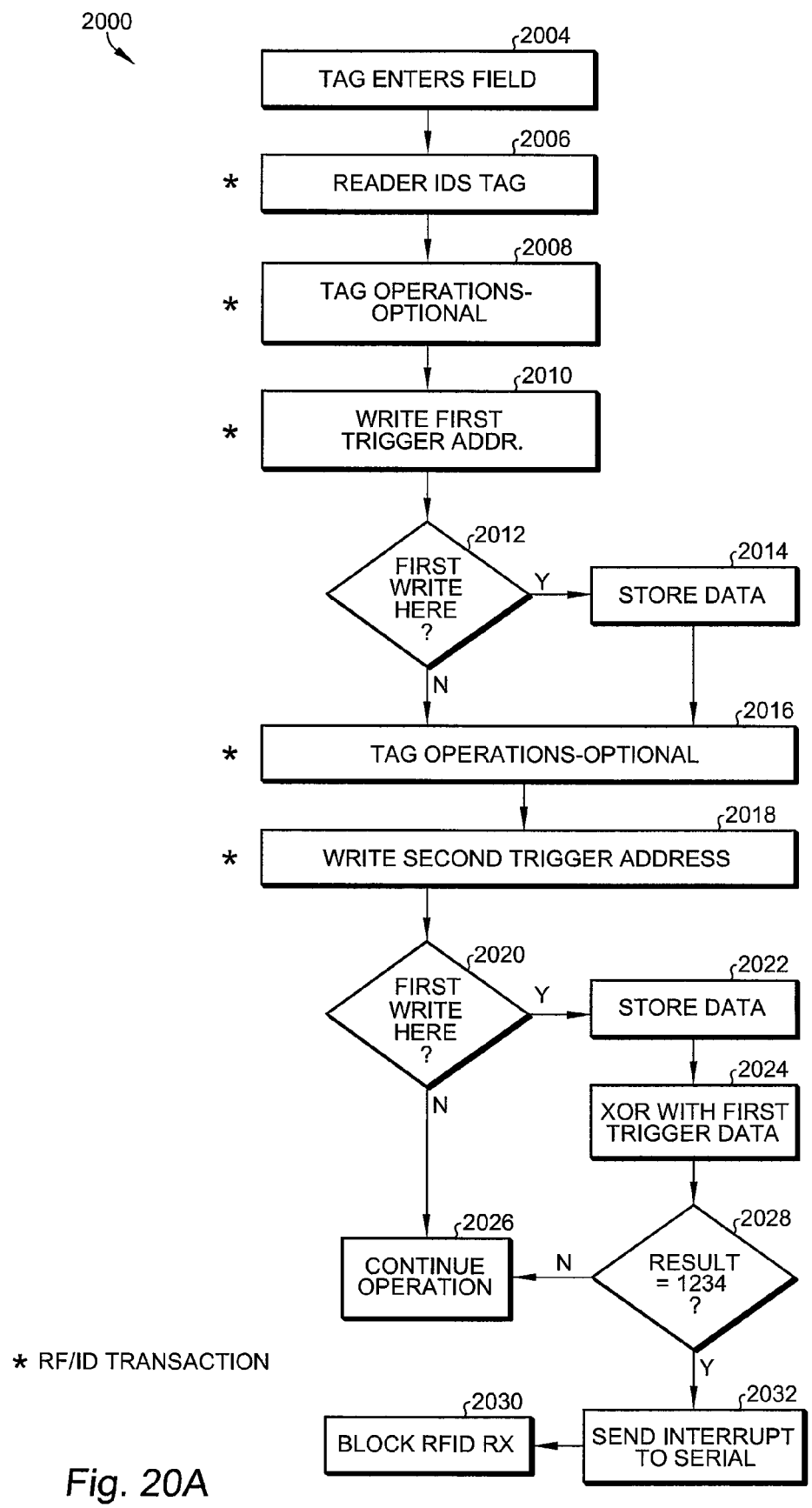
FIGS. 20A and 20B taken together represent a flow chart for performing an interrupt method according to the invention, associated with the interrupt manager block of FIG. 19.
Figure 20B:
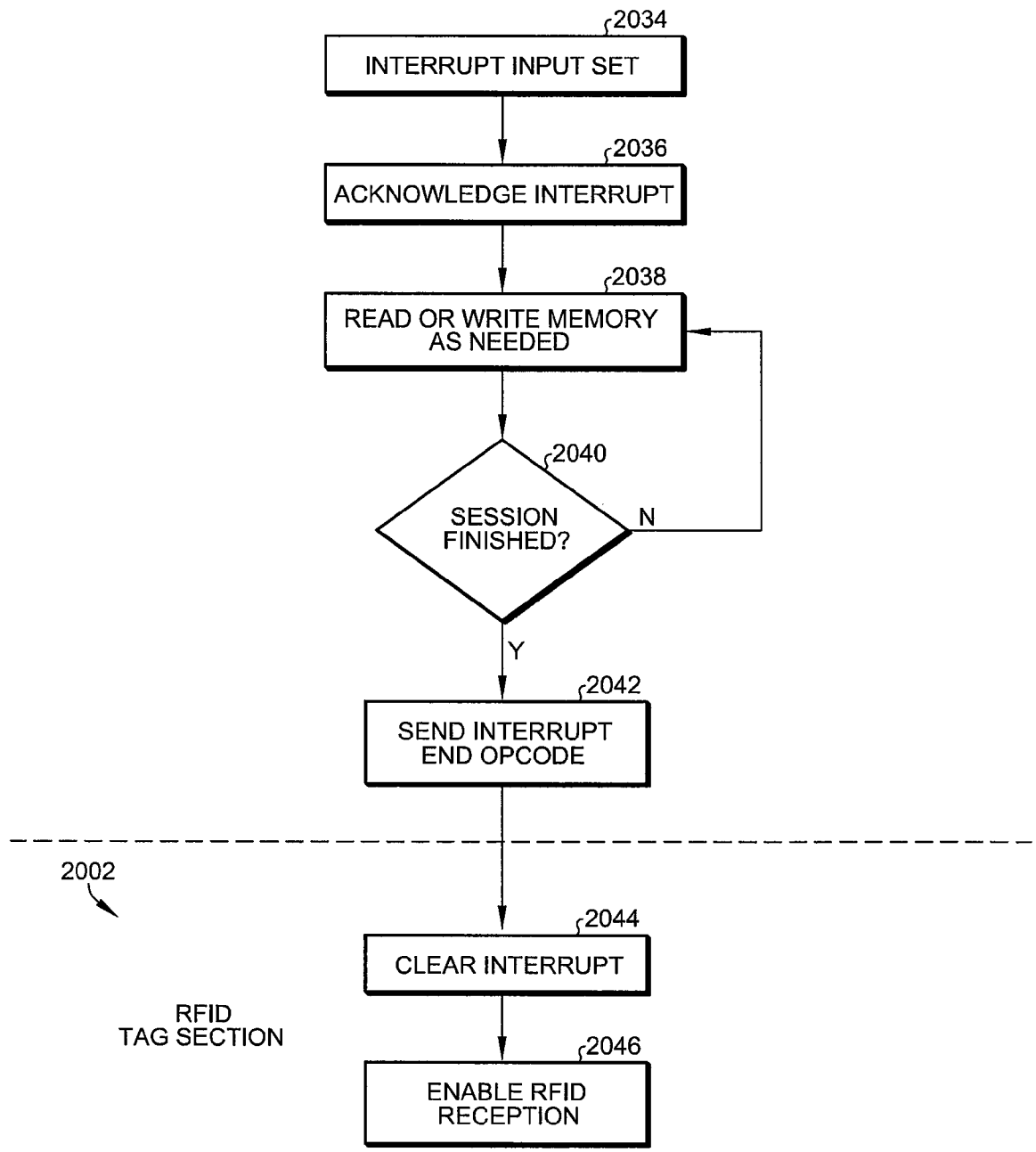

Referring now to FIGS. 20A and 20B the interrupt method of the present invention is shown in flow chart 2000. Referring to FIG. 20A, a tag or RFID chip enters the field at step 2004. At step 2006, the reader identifies the tag or RFID chip. At step 2008 optional tag operations are performed. At step 2020 a first trigger address is written. At decision block 2012 the question is asked if this is a first write at that location. If the answer is yes, the write data from the command is placed in a local register and the method continues at step 2016. If the answer is no, optional tag operations are performed at step 2016. At step 2018 a second trigger address is stored. At decision block 2020, the question is asked if this is a first write at that location. If the answer is yes, the write data from the command is placed in a second local register and the method continues at step 2024. At step 2024 the data in the second register is XORed with the first trigger data. At decision block 2028, the result of the XOR operation is compared to the value 1234. If it is no, then normal tag operations are continued at step 2026. If the answer at decision block 2020 is no, then operations are also continued at step 2026. If the answer at decision block 2028 is yes, then an interrupt signal is sent to the serial port chip select, and RFID reception is blocked at step 2030.

Referring now to FIG. 20B, the serial behavior of the microcontroller in the embedded application is shown in flow chart 2001. At step 2034 the microcontroller is interrupted with the previously described rising edge on the chip select pin. At step 2036 the microcontroller acknowledges the interrupt. At step 2038, the memory in the RFID chip is read or written to as required. Decision block 2040 shows that these memory interactions may be a single or multiple operations before the session is finished. If no, then the memory is read from or written to as required. If yes, the method is continued at step 2042, wherein an Interrupt End OpCode is sent.

Flow chart 2002 again describes the operations pertaining to the RFID tag or integrated circuit. At step 2044 the interrupt is cleared, and at step 2046 RFID reception is again enabled.

The memory access control system of the present invention does not have a sophisticated means of coordinating access to the memory between the two different interfaces. Instead, the RFID side is chosen to be the master, which controls all accesses. In the present invention, the secondary serial interface is told when it can access the memory by the RFID master.

The interrupt method of the present invention is used to wake up the external device which communicates via the serial interface. An acknowledge sequence is used to assure reception of the interrupt and lock out the RFID while the serial interface is in control of the memory. This prevents a case where the RFID alone sets the interrupt condition, but the serial interface never responds, and the RFID is forever locked out. Instead, the lockout is under control of the serial interface, and ensures that there cannot be a case where the two interfaces fight for access to the memory. When the serial interface is finished, an Interrupt End op-code is used to re-allow the RFID to have access to the memory as well as blocking further serial access until the next interrupt cycle.

The memory access control block is essentially a set of multiplexers. The RFID and the Serial interfaces both provide Address, Data and Select controls. Normally, the multiplexers steer the RFID controls to the memory. During an interrupt session, the multiplexers are uniformly switched to the Serial controls and the RFID controls are blocked. If the memory is in the middle of an access cycle, there is a feedback mechanism from the FRAM memory which does not allow this switch to occur before the access is complete.

The second advantage of this method according to the present invention is that it allows the RFID to communicate directly with the serial interface at the time of its choosing in a closed loop. That is, since it controls the interrupt, it can initiate the activity of the serial interface. Without an interrupt, the serial interface would interact with the memory on its own cadence, and the RFID interface would have to continually check the status.

It will be apparent to those skilled in the art that various modifications and variation can be made in the present invention without departing from the spirit or scope of the invention. As would be apparent to those skilled in the art equivalent embodiments of the present invention can be realized in firmware, software, or hardware, or any possible combination thereof. In addition, although representative block diagrams are shown for an aid in understanding the invention, the exact boundaries of the blocks may be changed and combined or separated out as desired for a particular application or implementation. Finally, although FRAM memory is described and claimed, the present invention is also applicable to any other high speed non-volatile memory technology. Thus, it is intended that the present invention cover the modifications and variations of this invention provided they come within the scope of the appended claims and their equivalents.

What is claimed is:

1. A method of writing to a memory, the method comprising:
   maintaining a memory pointer at a fixed read/writeable memory location in the memory; and
   responsive to receiving a write command in a single wireless/RFID operation recognizing a trigger address contained in the write command as an instruction for an indirect write, writing the data to the memory locations starting at an address stored in the memory pointer and incrementing, when the writing is complete, the address stored in the memory pointer to be an address of a location in the memory to which further data may be written, wherein incrementing includes determining a range of memory locations in which data may be written, and storing in the memory pointer a lowest address of the range of memory locations.

2. The method of claim 1 further comprising allowing the address stored in the memory pointer to automatically wrap back to the original lowest address of the range of locations.

3. The method of claim 1 further comprising locking data that is in locations with addresses below the address in the memory pointer so that the locations cannot be overwritten by another operation, including a direct write to the memory.

4. The method of claim 1 performed on a FRAM memory.

5. The method of claim 1 wherein the memory is resident on an RFID tag.

6. The method of claim 1 performed in conjunction with a controller.

7. A memory circuit comprising:
a state machine;
a memory; and
pointer circuitry coupled between the state machine and the memory;
wherein the memory has a fixed read/writeable location at which is located a memory pointer; and
wherein the state machine and pointer circuitry are operable to responsive to receiving a write command in a single wireless/RFID operation write data to the memory starting at an address stored in the memory pointer upon recognizing a trigger address in a write command, and operable to increment the address stored in the memory pointer when the data write is complete to a next available location in the memory to which further data may be written,
wherein incrementing includes determining a range of memory locations in which data may be written, and storing in the memory pointer a lowest address of the range of memory locations.

8. The memory circuit of claim 7 wherein the state machine comprises a Gen 2 EPC (Generation 2 Electronic Product Code) state machine for providing the increment, load, address, and pointer control signals.

9. The memory circuit of claim 8 wherein the pointer circuitry comprises an incrementer for receiving the increment control signal.

10. The memory circuit of claim 8 wherein the pointer circuitry comprises an address pointer register for receiving the load control signal.

11. The memory circuit of claim 8 wherein the pointer circuitry comprises a multiplexer for receiving the pointer control signal.

12. The memory circuit of claim 7 wherein the pointer circuitry comprises: an incrementer; an address pointer register coupled to the incrementer; a multiplexer coupled to the state machine, the address pointer register, and the memory.

13. The circuit of claim 7 wherein the circuit is resident on an RFID tag.

14. The circuit of claim 7 wherein in the state machine is capable of performing a single or a multiple memory read or write operation.

15. The circuit of claim 7 wherein the memory comprises FRAM memory.

16. An RFID system comprising:
an RFID tag configured to communicate using wireless transmissions with an RFID reader; wherein
the RFID tag comprises a memory including a fixed read/writeable memory location in which the RFID tag stores a memory pointer;
the RFID tag is configured to determine a range of memory locations in which data may be written and to store in the memory pointer a lowest address of the range of memory locations; and
the RFID tag is configured to responsive to receiving write command a write command from the RFID reader in a single wireless/RFID operation and in response to the write command recognize a trigger address in the write command as an instruction to perform an indirect write operation by which data is written to the memory starting at the address in the memory pointer, and increment, at the completion of the indirect write operation, the address stored in the memory pointer to be the lowest address of a memory location to which further data may be written,
wherein incrementing includes determining a range of memory locations in which data may be written, and storing in the memory pointer a lowest address of the range of memory locations.

17. The RFID system of claim 16, wherein the RFID tag comprises a FRAM memory.

18. The RFID system of claim 16, wherein the RFID tag further comprises a state machine and pointer circuitry, wherein the pointer circuitry is coupled between the state machine and the memory.

19. The RFID system of claim 18 wherein the pointer circuitry comprises: an incrementer; an address pointer register coupled to the incrementer; a multiplexer coupled to the state machine, the address pointer register, and the memory.

* * * * *